(12) United States Patent
Darabi

(10) Patent No.: US 8,218,693 B2
(45) Date of Patent: Jul. 10, 2012

(54) GAIN CONTROL FOR WIRELESS RECEIVER

(75) Inventor: Hooman Darabi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 835 days.

(21) Appl. No.: 11/371,850

(22) Filed: Mar. 9, 2006

(65) Prior Publication Data

US 2007/0213022 A1 Sep. 13, 2007

(51) Int. Cl.
 *H04L 27/08* (2006.01)
(52) U.S. Cl. .............................. 375/345; 455/250.1
(58) Field of Classification Search .............. 375/345, 375/316; 455/250.1
See application file for complete search history.

(56) References Cited

U.S. PATENT DOCUMENTS

| | | | |
|---|---|---|---|
| 5,241,702 A | 8/1993 | Dent | |
| 5,568,070 A | 10/1996 | Osaki et al. | |
| 5,732,334 A | 3/1998 | Miyake | |
| 5,749,051 A | 5/1998 | Dent | |
| 6,404,293 B1 | 6/2002 | Darabi et al. | |
| 6,727,839 B2 | 4/2004 | Mulder et al. | |
| 6,845,232 B2 | 1/2005 | Darabi | |
| 6,862,438 B2 | 3/2005 | Darabi | |
| 6,931,267 B2 | 8/2005 | Darabi | |
| 6,961,552 B2 | 11/2005 | Darabi et al. | |
| 6,968,019 B2 | 11/2005 | Darabi et al. | |
| 6,970,681 B2 | 11/2005 | Darabi et al. | |
| 7,085,334 B2 * | 8/2006 | Burke et al. .................. | 375/345 |
| 7,203,511 B2 | 4/2007 | Trachewsky et al. | |
| 7,268,598 B2 | 9/2007 | Zolfaghari | |
| 7,512,423 B2 | 3/2009 | Karaoguz | |
| 2002/0094037 A1 | 7/2002 | Darabi et al. | |
| 2003/0067359 A1 | 4/2003 | Darabi et al. | |
| 2003/0083031 A1 * | 5/2003 | Eriksson et al. ........... | 455/250.1 |
| 2003/0092465 A1 | 5/2003 | Darabi et al. | |
| 2003/0181175 A1 | 9/2003 | Darabi | |
| 2003/0181176 A1 | 9/2003 | Darabi | |
| 2003/0181179 A1 | 9/2003 | Darabi | |

(Continued)

OTHER PUBLICATIONS

Non-Final Rejection regarding U.S. Appl. No. 11/395,907 mailed on Feb. 23, 2009.

(Continued)

*Primary Examiner* — Chieh M. Fan
*Assistant Examiner* — Freshteh N Aghdam
(74) *Attorney, Agent, or Firm* — Brake Hughes Bellermann LLP

(57) ABSTRACT

Various embodiments are disclosed relating to a gain control for a wireless receiver. In an example embodiment, a wireless receiver is provided that may include an analog gain circuit adapted to provide a variable analog gain on a received input signal, an analog to digital converter (ADC) having an input coupled to an output of the analog gain circuit, and a digital gain circuit having an input coupled to an output of the ADC and adapted to provide a variable digital gain on a received digital signal from the ADC. According to an example embodiment, the wireless transceiver may decrease a gain of the analog gain circuit while maintaining a gain of the digital gain circuit substantially constant for a receiver input signal level that increases from a first input signal level up to at least a first test signal level. In addition, in an example embodiment, the wireless receiver may also decrease a gain of the analog gain circuit while maintaining a gain of the digital gain circuit substantially constant for a signal level of the input signal that increases from a first input signal level up to at least a blocker test signal level.

14 Claims, 7 Drawing Sheets

U.S. PATENT DOCUMENTS

| | | |
|---|---|---|
| 2003/0181180 A1 | 9/2003 | Darabi |
| 2003/0181181 A1 | 9/2003 | Darabi |
| 2003/0181184 A1 | 9/2003 | Darabi |
| 2003/0181188 A1 | 9/2003 | Darabi |
| 2004/0001560 A1 | 1/2004 | Darabi |
| 2004/0052312 A1 | 3/2004 | Matero |
| 2004/0102173 A1* | 5/2004 | Darabi .................. 455/307 |
| 2004/0137870 A1 | 7/2004 | Kivekas et al. |
| 2005/0113948 A1 | 5/2005 | Own |
| 2005/0130615 A1 | 6/2005 | Darabi |
| 2005/0164671 A1 | 7/2005 | Darabi |
| 2005/0197092 A1 | 9/2005 | Darabi |
| 2005/0237100 A1 | 10/2005 | Chiu et al. |
| 2006/0002491 A1 | 1/2006 | Darabi |
| 2006/0003719 A1 | 1/2006 | Darabi |
| 2006/0035609 A1 | 2/2006 | Darabi |
| 2006/0035668 A1 | 2/2006 | Li |
| 2007/0076827 A1* | 4/2007 | Beamish et al. ............... 375/345 |
| 2007/0230616 A1 | 10/2007 | Zolfaghari et al. |

OTHER PUBLICATIONS

Non-Final Rejection response regarding U.S. Appl. No. 11/395,907 mailed on Jul. 23, 2009.
Non-Final Rejection regarding U.S. Appl. No. 11/395,907 mailed on Nov. 16, 2009.
Non-Final Rejection response regarding U.S. Appl. No. 11/395,907 mailed on Mar. 16, 2010.
Final Rejection regarding U.S. Appl. No. 11/395,907 mailed on Jun. 15, 2010.

* cited by examiner

Example Receiver Gain Control

| Input Range (dBm) 502 | | LNA Gain (dB) 504 | BPF Gain (dB) 506 | Analog Gain (dB) 508 | Dig. Gain (dB) 510 | Total Gain (dB) 512 | ADC In (dBm) 514 | Comments 516 |
|---|---|---|---|---|---|---|---|---|
| <-109 | -109 | 30 | 35 | 59 | 30 | 89 | -50 | |
| -109 | -106.5 | 30 | 32.5 | 56.5 | 30 | 86.5 | -50 | |
| -106.5 | -104 | 30 | 30 | 54 | 30 | 84 | -50 | |
| -104 | -101.5 | 25 | 32.5 | 51.5 | 30 | 81.5 | -50 | |
| -101.5 | -99 | 25 | 30 | 49 | 30 | 79 | -50 | Blocker test |
| -99 | -96.5 | 25 | 27.5 | 46.5 | 30 | 76.5 | -50 | |
| -96.5 | -94 | 25 | 25 | 44 | 30 | 74 | -50 | |
| -94 | -91.5 | 25 | 22.5 | 41.5 | 30 | 71.5 | -50 | |
| -91.5 | -89 | 25 | 20 | 39 | 30 | 69 | -50 | |
| -89 | -86.5 | 25 | 17.5 | 36.5 | 30 | 66.5 | -50 | |
| -86.5 | -84 | 25 | 15 | 34 | 30 | 64 | -50 | |
| -84 | -81.5 | 20 | 17.5 | 31.5 | 30 | 61.5 | -50 | Image test |
| -81.5 | -79 | 20 | 15 | 29 | 30 | 59 | -50 | |
| -79 | -76.5 | 20 | 12.5 | 26.5 | 30 | 56.5 | -50 | |
| -76.5 | -74 | 20 | 10 | 24 | 30 | 54 | -50 | |
| -74 | -71.5 | 20 | 7.5 | 21.5 | 30 | 51.5 | -50 | |
| -71.5 | -69 | 20 | 7.5 | 21.5 | 27.5 | 49 | -47.5 | |
| -69 | -66.5 | 20 | 7.5 | 21.5 | 25 | 46.5 | -45 | |
| -66.5 | -64 | 20 | 7.5 | 21.5 | 22.5 | 44 | -42.5 | |
| -64 | -61.5 | 20 | 7.5 | 21.5 | 20 | 41.5 | -40 | |
| -61.5 | -59 | 20 | 7.5 | 21.5 | 17.5 | 39 | -37.5 | |
| -59 | -56.5 | 20 | 7.5 | 21.5 | 15 | 36.5 | -35 | |
| -56.5 | -54 | 20 | 7.5 | 21.5 | 12.5 | 34 | -32.5 | |
| -54 | -51.5 | 20 | 7.5 | 21.5 | 10 | 31.5 | -30 | |
| -51.5 | -49 | 20 | 7.5 | 21.5 | 7.5 | 29 | -27.5 | Down-Fading test |
| -49 | -46.5 | 20 | 7.5 | 21.5 | 5 | 26.5 | -25 | |
| -46.5 | -44 | 20 | 7.5 | 21.5 | 2.5 | 24 | -22.5 | |
| -44 | -41.5 | 20 | 7.5 | 21.5 | 0 | 21.5 | -20 | |
| -41.5 | -39 | 0 | 25 | 19 | 0 | 19 | -20 | |
| -39 | -36.5 | 0 | 22.5 | 16.5 | 0 | 16.5 | -20 | |
| -36.5 | -34 | 0 | 20 | 14 | 0 | 14 | -20 | |
| -34 | -31.5 | 0 | 17.5 | 11.5 | 0 | 11.5 | -20 | |
| -31.5 | -29 | 0 | 15 | 9 | 0 | 9 | -20 | |
| -29 | -26.5 | 0 | 12.5 | 6.5 | 0 | 6.5 | -20 | |
| -26.5 | -24 | 0 | 10 | 4 | 0 | 4 | -20 | |
| -24 | -21.5 | 0 | 7.5 | 1.5 | 0 | 1.5 | -20 | |
| -21.5 | -19 | 0 | 5 | -1 | 0 | -1 | -20 | |
| -19 | -16.5 | 0 | 2.5 | -3.5 | 0 | -3.5 | -20 | |
| -16.5 | -14 | 0 | 0 | -6 | 0 | -6 | -20 | |

FIG. 5

GAIN CONTROL FOR WIRELESS RECEIVER

BACKGROUND

Wireless transceivers are used in a wide variety of wireless systems. A wireless transceiver may typically include a wireless receiver for receiving and demodulating signals, and a transmitter for modulating signals for transmission. Wireless transceivers may be capable of transmitting on different frequencies or bands. It may be a challenge in some cases for receivers to sufficiently reject an image or blocker signal while making use of a dynamic range of the receiver components.

SUMMARY

Various embodiments are disclosed relating to wireless systems, and also relating to a gain control for a wireless receiver.

According to an example embodiment, a wireless receiver is provided that may include an analog gain circuit adapted to provide a variable analog gain on a received input signal, an analog to digital converter (ADC) having an input coupled to an output of the analog gain circuit, and a digital gain circuit having an input coupled to an output of the ADC and adapted to provide a variable digital gain on a received digital signal from the ADC. According to an example embodiment, the wireless transceiver may decrease a gain of the analog gain circuit while maintaining a gain of the digital gain circuit substantially constant for a signal level of the input signal that increases from a first input signal level up to at least a first test signal level (e.g., blocker test signal level or image test signal level). In addition, in an example embodiment, the wireless receiver may also decrease a gain of the analog gain circuit while maintaining a gain of the digital gain circuit substantially constant for a signal level of the input signal that increases from a first input signal level up to at least a blocker test signal level.

For example, by decreasing the analog gain while holding the digital gain constant up to a blocker test and/or image test, this may allow the receiver to better accommodate large blocker and/or image signals and pass the blocker and/or image tests. Also, by thereafter holding the analog gain constant and decreasing the digital gain as the receiver input signal level increases, this may allow an input signal level to the ADC to increase, which may a better use of the full dynamic range of the ADC.

According to another example embodiment, a method of varying gain in a wireless receiver is provided. The wireless receiver may include an analog-to-digital converter (ADC), an analog gain circuit coupled to an input of the ADC, and a digital gain circuit coupled to an output of the ADC. The method may include varying a gain of the analog gain circuit to maintain a substantially constant signal level at an input to the ADC while maintaining the gain of the digital gain circuit at a substantially constant level as the input signal to the receiver varies between a first input signal level up to a first test signal level. The method may also include maintaining the gain of the analog gain circuit substantially constant while decreasing the gain of the digital gain circuit for a receiver input signal level that increases from the first test signal level up to at least a second input signal level.

BRIEF DESCRIPTION OF THE DRAWINGS

FIG. 5 is a chart illustrating an example gain control for the receiver of FIG. 4 according to an example embodiment.

DETAILED DESCRIPTION

Figure 1:
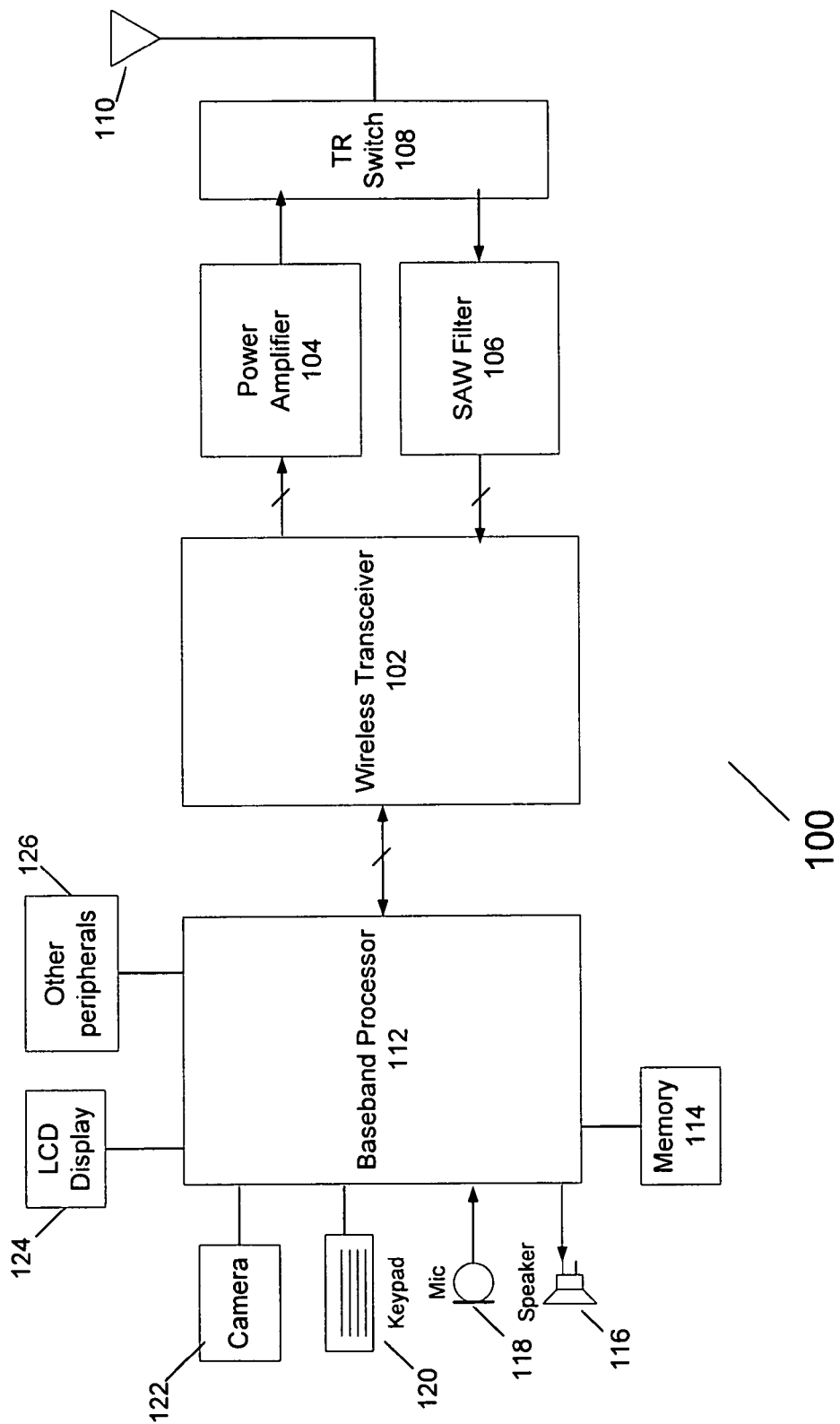
FIG. 1 is a block diagram of a wireless system according to an example embodiment.

FIG. 1 is a block diagram of a wireless system according to an example embodiment. Wireless system 100 may include a wireless transceiver (transmitter/receiver) 102 for transmitting and receiving radio or wireless signals. A baseband processor 112 is coupled to wireless transceiver 110 to perform various types of processing and overall control of system 100, and may perform other tasks. Baseband processor 112 may include a controller, and may include for example, an audio codec to process audio signals, a video or image processing codec (e.g., an MPEG4 compression and/or decompression module), and other components or blocks, not shown.

An antenna 110 may be provided to receive and transmit radio signals or electromagnetic signals. A transmitter/receiver (TR) switch 108 may select either the transmit or receive mode for the antenna 110. Signals output by wireless transceiver 102 to be transmitted may be amplified by amplifier 104 and then transmitted via antenna 110. Signals received via antenna 110 may be filtered by a SAW (surface acoustic wave) filter 106 (or other filter) and then input to transceiver 102. At transceiver 102, the received signals may be processed or demodulated, which may include down-converting the signals to an intermediate frequency (IF) and then down-converting to baseband or other frequency, digital detection of data and other signal processing. Likewise, digital data to be transmitted may be received by transceiver 102 from baseband processor 112. Wireless transceiver 110 may modulate the digital data from baseband processor 112 onto a selected channel or frequency (or range or spectrum of frequencies) for transmission over antenna 110.

A variety of blocks or peripherals may be coupled to baseband processor 112. For example, a memory 114, such as a Flash memory or Random Access Memory (RAM), may store information. A microphone 118 and speaker 116 may allow audio signals to be input to and output by wireless system 100, such as for a cell phone or other communications device. A keypad 120 may allow a user to input characters or other information to be processed by wireless system 100. A camera 122 or other optical device may be provided to allow users to capture photos or images that may be processed and/or stored by system 100 in memory or other storage location. Wireless system 100 may also include a display 124, such as a liquid crystal display for example, to display information (text, images, etc.). A variety of other peripherals 126 may be coupled to baseband processor 112, such as a memory stick, an audio player, a Bluetooth wireless transceiver, a USB (Universal Serial Bus) port, or other peripheral. These are merely a few examples of the types of devices or peripherals that may be provided as part of wireless system 100 or coupled to baseband processor 112, and the disclosure is not limited thereto.

Wireless system 100 may be used in a variety of systems or applications, such as a mobile or cellular phone, a wireless local area network (WLAN) phone, a wireless personal digital assistant (PDA), a mobile communications device, or other wireless device. In an example embodiment, wireless system 100 may be capable of operating in a variety of transmit/receive frequencies or frequency bands and for a variety of different standards or communications protocols. Although not required, wireless system 100 may be a multi-band wireless system capable of transmitting or receiving signals on one of a plurality of frequencies or bands. For example, wireless system 100 may operate at or around 1900 MHz for WCDMA (Wide-Band Code Division Multiple Access) or PCS (Personal Communications Services), at or around 1800 MHz for DCS (Distributed Communication Services) (these frequencies may be considered an upper band of frequencies), at 850 MHz for GSM (Global System for Mobile communication), at or around 900 MHz for EGSM (Extended GSM) (these frequencies may be considered a lower band of frequencies). These are merely some example frequencies, and the system 100 may operate at many other frequencies and standards.

Figure 2:
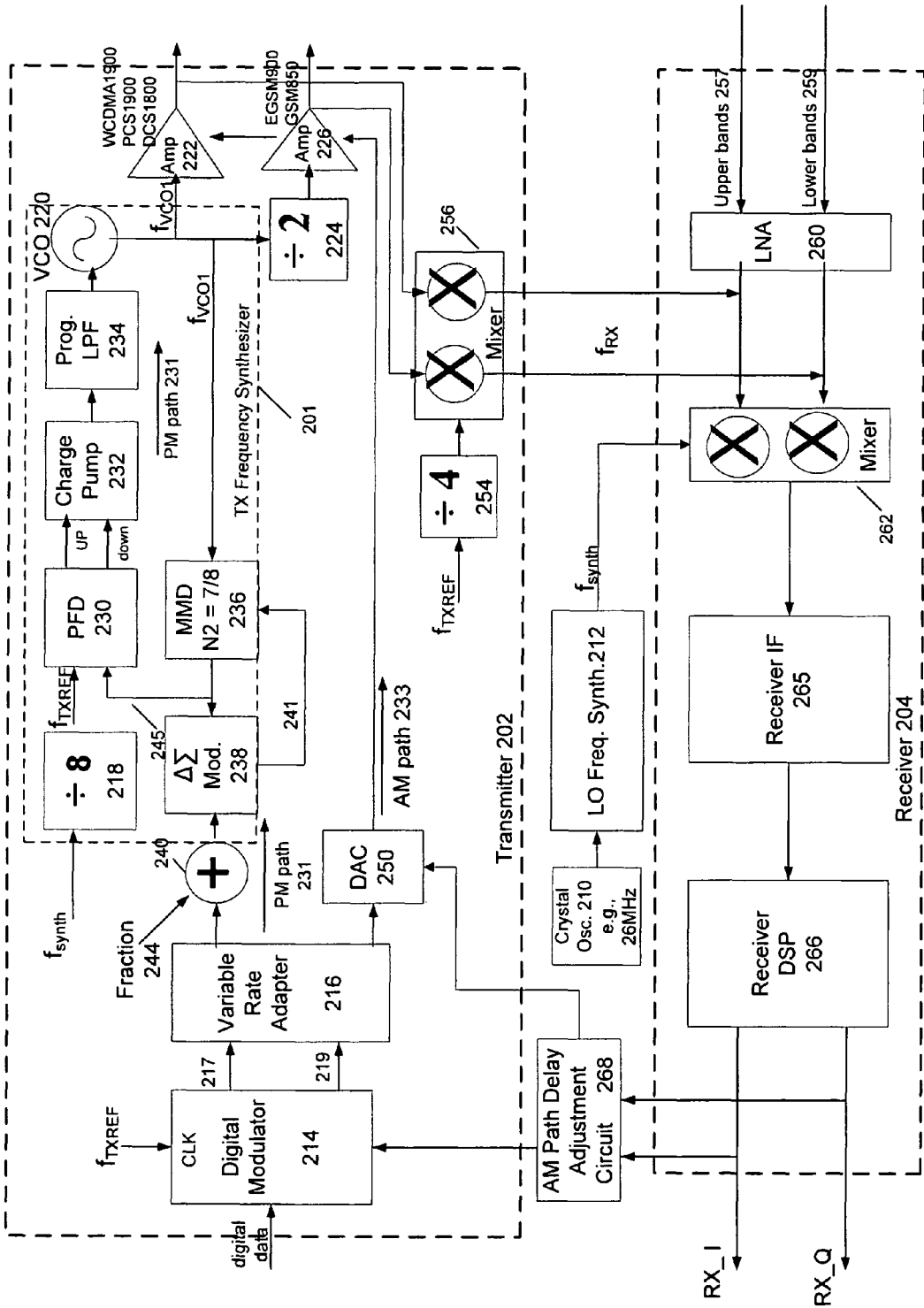
FIG. 2 is a block diagram of a wireless transceiver according to an example embodiment.

FIG. 2 is a block diagram of a wireless transceiver according to an example embodiment. Wireless transceiver 102 may include a transmitter 202 to modulate and transmit data, and a receiver 204 to receive and demodulate data. A crystal oscillator 210 may generate a signal at a constant frequency, such as 26 MHz or other frequency (26 MHz is merely an example and other frequencies may be used). A local oscillator (LO) frequency synthesizer 212 may generate a synthesized frequency signal ($f_{synth}$) at a selected one of a plurality of frequencies, e.g., based on a selected channel. The synthesized frequency signal ($f_{synth}$) may be used by both the transmitter 202 and receiver 204 as a reference signal.

A digital modulator 214 may receive digital data and output data onto one or more paths. According to an example embodiment, transmitter 102 may modulate received data using a variety of Phase Shift Keying (PSK), such as 8PSK, Quadrature Amplitude Modulation (QAM), etc., in which data may be modulated using both phase modulation and amplitude modulation. Digital modulator 214 may alternatively modulate received data using phase modulation or frequency modulation, or variations thereof, such as Gaussian-Filtered Minimum Shift Keying (GMSK), and the like. According to an example embodiment, for such a phase modulation or frequency modulation or GMSK modulation, or the like, the amplitude of the signal output by transmitter 202 may be, for example, set to a constant amplitude or level.

To be able to accommodate different frequencies and different channels, fynth may be a variable frequency between, for example, 1.752 GHz and 2.0 GHz. This is merely an example frequency range, and other frequencies or frequency ranges may be used. $f_{synth}$ may be frequency divided by frequency divider 218 to generate a transmit reference frequency ($f_{TXREF}$). In an example embodiment, frequency divider 218 may be a divide by 8. Therefore, $f_{TXREF}$ may be generated as $f_{synth}/8$ and in such case, $f_{TXREF}$ may vary between 219 MHz and 250 MHz, for example.

Digital modulator 214 may receive digital data and output signals on both lines 217 and 219 to a variable rate adapter 216. In an example embodiment, digital modulator 214 may use $f_{TXREF}$ as a clock. As noted, $f_{TXREF}$ may be a variable frequency. Variable rate adapter 216 may compensate for the variable rate clock ($f_{TXREF}$) that may be used by digital modulator 214, e.g., such that signals output by variable rate adapter 216 may be output at a constant frequency even though clock for digital modulator 214 may vary.

In order to perform both phase modulation (PM) (or a variation thereof) and amplitude modulation (AM) on the received digital data, such as for 8PSK or QAM or the like, variable rate adapter 216 may output signals onto two paths including: 1) a PM path 231 to perform phase modulation based on received data; and 2) an AM path 233 to perform amplitude modulation based on the received data.

The PM path will now be discussed. In the PM path 231, a transmit frequency synthesizer 201 may include a phase-locked loop (PLL) and a delta-sigma modulator 238. Within the transmit frequency synthesizer 201, a voltage controlled oscillator (VCO) 220 may output a signal at an operating frequency for a selected channel for a selected band of a service (e.g., channel number 2 at a center frequency of 1710.2 MHz for DCS). For example, a base station or Access Point (AP) may assign the wireless system 100 a channel to use for data transmission. As described in more detail below, VCO 220 may output a range of frequencies or a modulated frequency spectrum for the selected channel, with the data being modulated onto the frequency spectrum. VCO 220 may also include a gain, or an amount which the output spectrum from VCO 220 is amplified. This gain (K) of VCO 220 may be referred to as $K_{VCO}$. In an example embodiment, the gain of VCO 220 ($K_{VCO}$) may be calibrated.

The frequency spectrum output by VCO 220 may then be amplified by upper band amplifier 222 for transmission via antenna 110. The frequency spectrum output by VCO 220 may also be divided by two by frequency divider 224 and then amplified by lower band amplifier 226 for data transmission over antenna 110. Thus, according to an example embodiment, a frequency spectrum for a selected channel in the upper band of frequencies may be amplified and output by amplifier 222, while a frequency spectrum for a selected channel in the lower band of frequencies may be amplified and output by amplifier 226.

As noted above, transmit frequency synthesizer 201 may include a PLL. According to an example embodiment, the phase-locked loop (PLL) within transmit frequency synthesizer 201 may control or lock the VCO 220 to a desired or selected operating frequency (channel). The PLL within transmit frequency synthesizer 201 may include, for example, a phase-frequency detector (PFD) 230, a charge pump 232 and a programmable low pass filter (LPF) 234 (also referred to as a loop filter), and may include other or different components, since this is merely an example PLL. The output ($f_{VCO1}$) of VCO 220 may include an operating frequency of a selected channel (e.g., center frequency). An integer-N (frequency) divider 236 is coupled to the feedback loop of the PLL, and may divide a received frequency by a selected divider number (e.g., an integer, either 7 or 8). The output frequency of VCO 220 ($f_{VCO1}$) is divided by a divider number (N2) of integer-N divider 236 that is selected by a 1-bit delta-sigma ($\Delta\Sigma$) modulator 238 via line 241. Integer-N divider 236 may be considered to be a multi-modulus divider (MMD) since the divider number (N2) used by integer-N divider 236 may be one of multiple different numbers (integers). The transmit frequency synthesizer 201 may provide a selected fractional-N divide ratio (average N2) by dynamically switching the divider number (N2) of integer-N divider 236 between two or more integer numbers. Thus, transmit frequency synthesizer 201 may be considered to be a fractional-N frequency synthesizer.

In an example embodiment, the divider number used by integer-N divider 236 may be either 7 or 8, based on the signal (bit) received from delta-sigma modulator 238 via line 241 (e.g., a 0 output on line 241 by modulator 238 to indicate a 7 for the divider number N2, while a 1 indicating an 8 for divider number N2). Therefore, according to an example embodiment, the operating frequency output by VCO 220 may be $f_{VCO1}=N2*f_{TXREF}$. The integer divider numbers of 7 or 8 may allow only two operating frequencies to be output by VCO 220 for a particular $f_{TXREF}$ (transmitter reference frequency). However, by varying the selected integer divider number used by integer-N divider 236, almost any (average) fractional-N divide ratio (average N2) between 7 and 8 may be obtained, which may allow VCO 220 to output a range of frequencies.

In order to lock or control the VCO 220 to a desired to selected output frequency (for the selected channel), a $f_{synth}$ (and thus $f_{TXREF}$) is selected, and an average fractional-N divide ratio (average N2) is selected between 7 and 8 (in this example embodiment, although any numbers may be used) that will provide the selected operating frequency output by VCO 220. For example, if a transmit operating frequency is assigned or selected of 1.661 GHz, then a transmit reference frequency ($f_{TXREF}$) may be selected of 220 MHz, and a (average) fractional-N divide ratio of 7.55 may be used. Thus, in this example, a VCO output (operating frequency for the channel) is thus obtained as: $f_{VCO1}=N2(average)*f_{TXREF}$, which in this case may be calculated as: $f_{VCO1}=7.55*220$ MHz=1.661 GHz, which is the desired operating frequency (e.g., center frequency for the assigned transmission channel).

The fractional-N divide ratio (7.55 in this example) between 7 and 8 may be obtained by using delta sigma modulator 238 to vary the divider number (N2) of integer-N divider 236 to divide by 7 and divide by 8 an appropriate amount or percentage to obtain the selected (average) fractional-N divide ratio (average N2). For example, to obtain a fractional-N divide ratio of 7.5, then the integer-N divider 236 would divide by 7 half of the time, and divide by 8 the other half of the time (50% duty cycle, half zeroes, half ones). By changing the duty cycle or percentage of zeros and ones output by delta sigma modulator 238 via line 241, the frequency ($f_{VCO1}$) received via line 243 may be divided by a selected fractional-N divide ratio (e.g., 7.55).

The fractional portion (0.55 in this example) of the selected fractional divider number (7.55 in this example) may be input to combiner 240. Combiner 240 may add or combine the fraction 244 (0.55 in this example) with a data signal (to provide phase modulation) output by variable rate adapter 216. The output of combiner 240 may control delta-sigma modulator 238 to obtain the (average) selected fractional-N divide ratio for transmit frequency synthesizer 201.

In an example embodiment, VCO 220 may not necessarily output a single tone or frequency, but rather, may output a modulated frequency spectrum, such as a phase modulated spectrum. In an example embodiment, the delta sigma modulator 238 may control the integer-N divider 236 to vary the divider number (N2) around the selected fractional divide ratio so as to cause VCO 220 to generate a phase modulated frequency spectrum. In part, the delta sigma modulator 238 may be controlled based on signals output via line 217 from digital modulator 214 (e.g., to allow phase modulation of the output signal output from VCO 220), and passed through (e.g., after compensation) by variable rate adapter 216. This may allow the output from VCO 220 ($f_{VCO1}$) to be a phase modulated frequency spectrum around a center frequency for the selected channel (the operating frequency selected by the fractional-N divide ratio, such as 7.55, for example).

An operation of the example PLL of transmit frequency synthesizer 201 of transmitter 202 will be briefly described. The transmitter reference frequency ($f_{TXREF}$) is input as a reference signal to PFD 230. The divided frequency signal output on line 245 from divider 236 is a second input to PFD 230. PFD 230 may generate an output signal(s) based on the phase difference between its two input signals. For example, an up signal or a down signal may be output by PFD 230 based on whether the divided frequency signal on line 245 leads or lags the reference frequency signal ($f_{TXREF}$), respectively. Charge pump 232 may generate positive or negative charge pulses based on whether the divided frequency signal on line 245 leads or lags the reference signal ($f_{TXREF}$), respectively. Programmable low pass filter (LPF) 234 may integrate or accumulate the charge pulses to generate a voltage, which, for example, may indicate the amount that the divided frequency signal on line 245 leads or lags the reference signal ($f_{TXREF}$). The voltage output by LPF 234 may control or adjust the frequency ($f_{VCO1}$) output by VCO 220.

Thus, via the PM path 231, VCO 220 may output a phase modulated frequency spectrum, which is then amplified and output by upper band amplifier 222. Similarly, the output from VCO 220 is divided by two by divider 224, and is then amplified and output by lower band amplifier 226.

In an example embodiment, LPF 234 (of the PLL) may set the loop bandwidth of the PLL. If the bandwidth of the LPF is too narrow, part of the output spectrum from VCO 220 may be clipped or distorted. Likewise, if the bandwidth of LPF 234 is too wide, this may introduce an unacceptable amount of noise into the system. Therefore, according to an example embodiment, a relatively narrow bandwidth may be used for LPF 234, such as 200 KHz (this is merely an example, and other bandwidths may be used). Also, in an example embodiment, digital modulator 214 may include an equalizer to account for some clipping or signal distortion that may occur due to the 200 KHz bandwidth of low pass filter (LPF) 234. In an example embodiment, LPF 234 may be an R-C (resistor-capacitor) filter, which may be calibrated.

In cases in which the transmitted signal may be both phase modulated and amplitude modulated, such as for 8PSK, QAM or the like, the AM path 231 may perform amplitude modulation on the phase modulated spectrum based on the received digital signals. As noted, the digital data is received by digital modulator 214. The digital modulator 214 may output data via two paths, to provide both phase modulation (via PM path 231) and amplitude modulation (via AM path 233).

The AM path 233 will now be briefly described. Digital modulator 214 outputs signals (e.g., via variable rate adapter 216) to digital-to-analog converter (DAC) 250. DAC 250 converts received digital signals to analog signals. The analog signals, which may represent or indicate an amplitude, are input to amplifiers 226 and 222. Amplifiers 226 and 222 may amplitude modulate (or vary the amplitude) of the phase modulated spectrum provided from the VCO 220 based upon the signals received from DAC 250 via AM path 233. Thus, signals received via the AM path 233 may control the amplitude or gain of the phase modulated signals (spectrum) output by transmitter 202. Therefore, amplifiers 222 and 226 may output an amplitude and phase modulated signal (e.g., frequency spectrum), according to an example embodiment.

In cases where only phase or frequency modulation is performed (such as, for example, GMSK for GSM and EGSM), then the amplitude value output by digital modulator 214 to DAC 250 may be set to a constant level, to provide a constant amplitude for the phase modulated spectrum output by amplifiers 222 and 226. In an embodiment, the constant amplitude used by DAC 250 for such modulations may be typically set to a maximum to provide a high saturated output power.

Receiver 204 of wireless transceiver 102 (FIG. 2) will now be briefly described. Wireless signals may be input to receiver 204, including upper (or high) band signals received via line 257, and lower band signals received via line 259. These received signals may be amplified by low noise amplifier (LNA) 260. During normal operation, the received wireless signal may be down converted by mixer 262, based on the synthesizer frequency ($f_{synth}$) output by LO frequency synthesizer 212 (e.g., the received signal may be mixed with $f_{synth}$ by mixer 262 to generate an IF signal). In an embodiment, the received signal may then be down converted to an intermediate frequency (IF) of 200 KHz, for example (although any frequency may be used for IF). The IF signal may be input to receiver IF block 265 (which may include, for example, filters, gain control and other circuits) where IF processing is performed. The signals output by receiver IF block 265 are input to a receiver DSP 266, which may include, for example, gain control and digital signal processor to down convert the IF signal to baseband. Receiver DSP 266 may output in-phase and quadrature-phase receive signals (RX_I, RX_Q, respectively). The receive signals (RX_I and RX_Q) may also be output to digital modulator 214 (connection not shown), and also to an AM path delay adjustment circuit 268.

Wireless systems, at least in some cases, may be required to meet one or more signal requirements. For example, some wireless technologies may require wireless transmissions meet (or fall within) a spectral mask.

One issue that may arise for wireless systems that employ two types of modulation, such as both amplitude and phase or frequency modulation (e.g., such as 8PSK, QAM, etc.) is that there may be a mismatch in the timing or delay for the phase modulation and amplitude modulation (or more generally, a mismatch in the delay of a first modulation path and a second modulation path). In some cases, if the mismatch in delay or timing through the AM path and PM path of the transceiver is significant, it may distort the output or transmitted signal such that the output signal does not meet one or more signal requirements (such as a spectral mask). Therefore, for example, to avoid violating a spectral mask or other signal requirements, it may be desirable for the delay (or timing) through the AM path 231 and PM path 233 to be well matched.

According to an example embodiment, the receiver 204 of transceiver 102 may be used to calibrate the delay or timing for the AM path 231 and PM path 233 of transmitter 202. The transmitter reference frequency $f_{TXREF}$ may be divided by four by frequency divider 254. This divided signal ($f_{TXREF}/4$) may be input to mixer 256. Mixer 256 may up-convert the frequency of the modulated transmit frequency spectrum (amplitude and phase modulated output spectrum from amplifiers 222 and 226) to receive frequencies (e.g., upper and/or lower band receive frequencies that can be processed by receiver 204). During delay path calibration mode, the up-converted modulated transmit frequency spectrum is then fed or input to receiver 204 for processing. The transmit frequency spectrum may be down converted by mixer 262 to IF (e.g., 200 KHz), and processed by receiver IF block 265 and receiver DSP 266. The processed (or demodulated) transmit spectrum may then be output via receive signals (RX_I and RX_Q). This processing of the signals at receiver 204 may be considered to be a form of demodulation, in an example embodiment.

The processed or demodulated transmit spectrum may then be analyzed by AM path delay adjustment circuit 268, e.g., to determine if the demodulated transmit spectrum meets one or more signal requirements, such as determining if the demodulated transmit spectrum meets or falls within a required spectral mask. Alternatively, path delay adjustment circuit 268 may determine if there is a significant mismatch between the timing or delay of the AM path 233 and PM path 231, for example. Path delay adjustment circuit 268 may then adjust the delay or timing of one or both of the AM path 233 and PM path 231, e.g., if the demodulated (or processed) transmit spectrum does not meet the one or more signal requirements or mask, or if there is a significant mismatch in the timing or delay between the AM path 233 and PM path 231, for example. Path delay adjustment circuit 268 may adjust the delay or timing of the AM path 233 or the PM path 231, or both.

In another example embodiment, the gain of VCO 220 may be calibrated. In such case, in an example embodiment, the loop bandwidth of the PLL and LPF 234 may be well defined, and the delay through the PLL (PM path) and the AM path may also be stable and well defined. As a result, this is one example where it may not be necessary to calibrate the modulation delay paths (AM and PM paths). Thus, in an example embodiment, the modulation path delay calibration may be optional, and may be disabled or turned of in some cases.

In an example embodiment, path delay adjustment circuit 268 may be an AM path delay adjustment circuit that may adjust the delay of the AM path 233, based on the analysis or evaluation of the demodulated transmit spectrum (e.g., if the demodulated spectrum does not meet the signal requirement or mask). For example, path delay adjustment circuit 268 may adjust the delay provided by DAC 250 in AM path 233. This process may be repeated and re-calibrated, e.g., another modulated transmit frequency spectrum signal may be up-converted by mixer 256 to the receive frequency, and input to the receiver 204, where the spectrum may be down converted to IF, down converted to baseband and processed (e.g., demodulated). The demodulated or receive-processed transmit spectrum may again be evaluated or analyzed, and then a delay or timing may be adjusted in one or both AM path 233 and PM path 231, if necessary, to improve the match in path delay or improve the quality of the output signal. In this manner, the AM path delay and PM path delay of transmitter 202 may be calibrated (e.g., measured and adjusted) by feeding the modulated transmit spectrum into the receiver 204 for processing.

Figure 3:
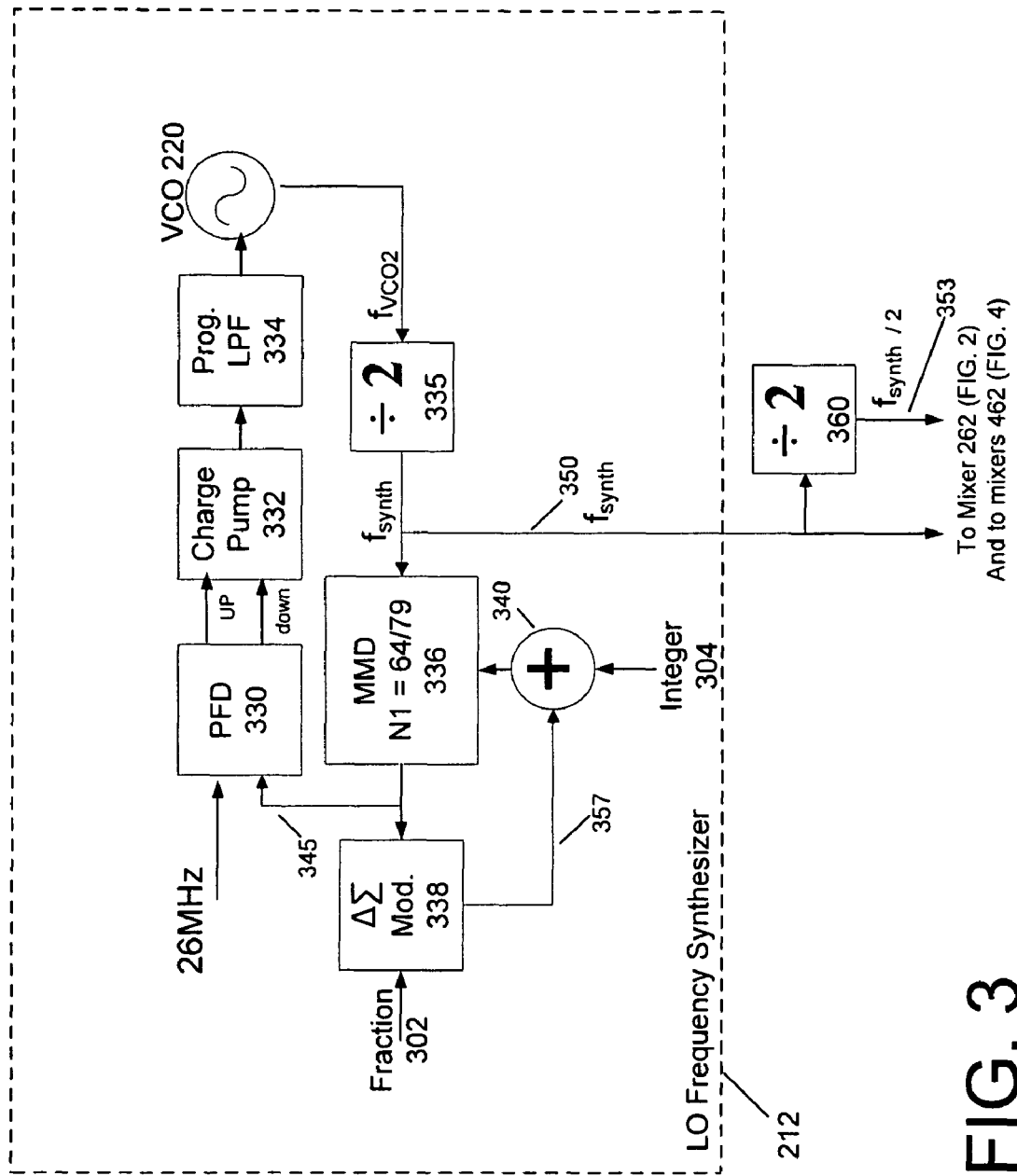
FIG. 3 is a block diagram illustrating a local oscillator (LO) frequency synthesizer of FIG. 2 according to an example embodiment.

FIG. 3 is a block diagram illustrating a local oscillator (LO) frequency synthesizer of FIG. 2 according to an example embodiment. LO frequency synthesizer 212 may be very similar to the transmit frequency synthesizer 201 in FIG. 2. LO frequency synthesizer 212 may include a phase-locked loop (PLL) and a delta-sigma modulator 338. According to an example embodiment, the phase-locked loop (PLL) within transmit frequency synthesizer 201 may control or lock the VCO 320 to output a desired or selected synthesized frequency ($f_{synth}$), e.g., based on a selected channel. The synthesized frequency ($f_{synth}$) output by LO frequency synthesizer 212 may be used as a reference frequency by the transmitter 202 and receiver 204.

The PLL within LO frequency synthesizer 212 may include, for example, a phase-frequency detector (PFD) 330, a charge pump 332 and a programmable low pass filter (LPF) 334 (also referred to as a loop filter), and may include other or different components, since this is merely an example PLL. The output ($f_{VCO2}$) of VCO 320 may include a tone or frequency that is divided by 2 by frequency divider 335, to generate the synthesized frequency ($f_{synth}$). An integer-N (frequency) divider 336 is coupled to the feedback loop of the PLL, and may divide a received frequency by a selected divider number (e.g., an integer, between 64 and 79). The synthesized frequency ($f_{synth}$) on line 350 is then divided by a divider number (N1) of integer-N divider 236 that is selected by a delta-sigma (ΔΣ) modulator 338 via line 357. Integer-N divider 336 may be considered to be a multi-modulus divider (MMD) since the divider number (N1) used by integer-N divider 336 may be one of multiple different numbers (integers), e.g., between 64 and 79. The LO frequency synthesizer 212 may provide a selected fractional-N divide ratio (average N1) by dynamically switching the divider number (N1) of integer-N divider 336 between two or more integer numbers. Thus, LO frequency synthesizer 212 may be considered to be a fractional-N frequency synthesizer.

In an example embodiment, the divider number used by integer-N divider 236 may be any number between 64 and 79, based on the signal received from delta-sigma modulator 338 via combiner 340. Combiner 340 may combine the output from modulator 338 with an integer 304. A fraction 302 may also be input to modulator 302. A 26 MHz reference input is used as one input to PFD 330. The other input to PFD 330 is the output from integer-N divider 336, via line 345. The PLL of LO frequency synthesizer 212 operates similarly to the PLL of transmit frequency synthesizer 201, described above. In general, by varying the selected integer divider number used by integer-N divider 336, almost any (average) fractional-N divide ratio (average N1) between 64 and 79 may be obtained, which may allow VCO 320 to output a range of frequencies. The PLL of LO frequency synthesizer 212 may operate to control or lock the output frequency $(f_{VCO2})$=26 MHz*2*N1. Thus, the frequency output from VCO 320 (and thus the frequency of $f_{synth}$) may be generated based on a selected average fractional-N divide ratio (average N1) for divider 336.

The frequency synthesizer signal ($f_{synth}$) may be input to mixer 262 (FIG. 2) and to mixer 462 (FIG. 4) via line 350, and may be used as a mixing signal to down convert upper band signals (e.g., PCS1900 and DCS1800 signals) to IF (e.g., 200 KHz), for example. In addition, the frequency synthesizer signal ($f_{synth}$) may be divided by 2 by frequency divider 360 and input via line 353 to mixer 262 and mixer 462. This signal ($f_{synth}/2$) received via line 353 may be used by quadrature mixers 262 and 462 to down convert lower band signals (e.g., EGSM900 and GSM850 signals) to IF (e.g., 200 KHz), for example.

Figure 4:
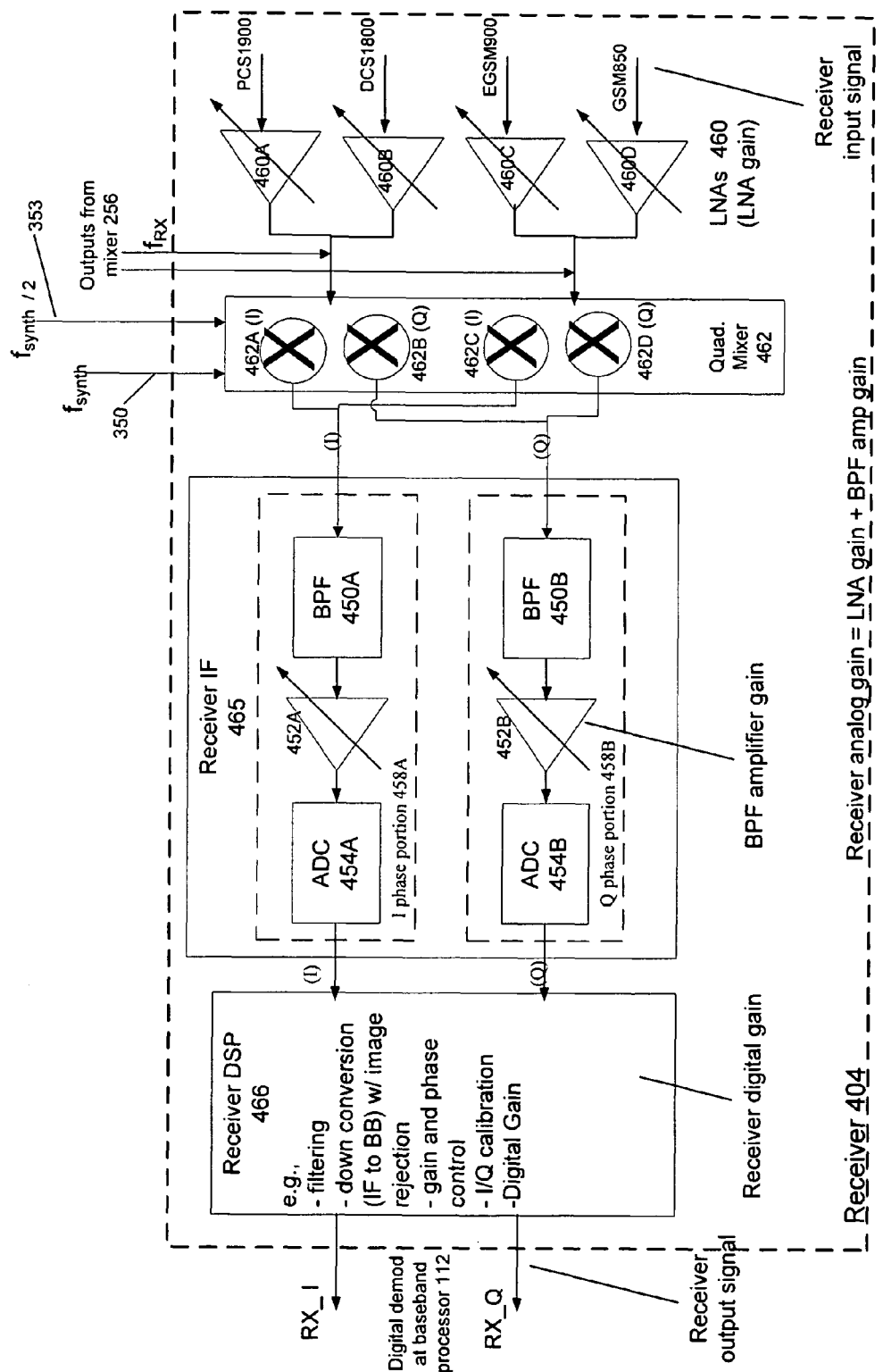
FIG. 4 is a block diagram of a receiver according to an example embodiment.

FIG. 4 is a block diagram of a receiver according to an example embodiment. Receiver 404 shown in FIG. 4 may replace (or be substituted for) receiver 204 in wireless transceiver 102 (FIG. 2), for example. Variable gain LNAs 460 may receive signals from different bands, e.g., LNA 460A may receive signals from PCS1900, LNA 460B may receive signals from DCS1800, LNA 460C may receive signals from EGSM900, and LNA 460D may receive signals from GSM850. As noted above, the PCS1900 and DCS1800 may be considered an upper band of RF signals, while EGSM900 and GSM850 may be considered a lower band of RF signals. In an example embodiment, in operation (non-calibration) mode, only one of LNAs 460 may be active at a time, based on a channel that has been selected or assigned to wireless transceiver 102 for receiving signals.

Quadrature mixers 462 are coupled to LNAs 460 to down convert the received signal to an IF signal (e.g., at 200 KHz). An output of upper band LNAs 460A and 460B are input to in-phase mixer 462A and quadrature-phase mixer 462B to generate in-phase (I) and quadrature phase (Q) signals, respectively, at IF based on a mixing signal ($f_{synth}$) input to mixers 462 via line 350. Similarly, an output from lower band LNAs 460C and 460D are input to in-phase (I) mixer 462C and quadrature-phase (Q) mixer 462D. In-phase mixer 462C and quadrature-phase mixer 462D generate in-phase (I) and quadrature phase (Q) signals, respectively, at IF based on the received lower band RF signal (e.g., GSM850 signal or EGSM900 signal) and based on a mixing signal ($f_{synth}/2$) input to mixers 462 via line 353. Quadrature-phase mixers 462B and 462D may also, for example, introduce a 90 degree phase offset (or a predetermined phase offset), for example.

A receiver IF block 465 is coupled to an output of mixers 462 to perform IF processing. The in-phase (I) and quadrature-phase (Q) signals output by mixers 462 are input to an in-phase portion 458A and a quadrature-phase portion 458B, respectively, of receiver IF block 465. In-phase portion 458A may include, for example, a tunable (or adjustable) band-pass filter (BPF) 450A to filter the received analog I signal, a variable gain amplifier 452A to amplify the output from BPF 450A, and an analog-to-digital converter (ADC) 454A to convert the filtered and amplified analog in-phase signal to a digital form. Similarly, Q-phase portion 458B of receiver IF block 465 may include a BPF 450B, a variable gain amplifier 452B and an ADC 454B to similarly process the quadrature-phase (Q) signal from mixers 462. In an example embodiment, BPFs 450 may also include a variable gain. In an example embodiment, ADCs 454A and 454B may be relatively high dynamic range, 14-bit delta-sigma (ΔΣ) ADCs, with, for example, approximately 88 dB or more of dynamic range. The use of a relatively high dynamic range ADC may, for example, allow a wide range of signal amplitudes to be received (including both a desired signal and an image signal (s)) and converted to digital form without saturating the ADC. This is merely one example embodiment for ADCs 454, and others may be used. The 200 KHz digital I and Q signals output from receiver IF 465 are input to a receiver digital processor, such as a digital signal processor (DSP) 466, for further processing as digital signals (digital processing). For example, receiver DSP 466 may perform additional filtering, gain (amplitude) and phase control, and down conversion for each of the received digital I and Q IF signals. As described in more detail below, the receiver DSP 466 may also perform a digital I/Q calibration to improve the rejection (or cancellation) of image signals at the receiver 404.

The use of an IF frequency at or around 200 KHz, as an example, allows BPFs 450A and 450B to effectively or substantially filter the received signal and thereby remove a DC offset in the received analog I and Q signals, for example. A relatively high IF frequency (such as 200 KHz) also may have an advantage of being less sensitive to flicker nose, frequency noise, and may have a higher IIIP2 (second order input intercept point). However, such a high IF may present some challenges in the rejection or cancellation of image signals. Due to the operation of mixers 462, an image signal at an image frequency that may be, for example 2*IF away from the desired (channel) frequency may typically be received and also down converted by mixers 462. For example, an image signal that is 400 KHz away from the desired signal frequency may be down converted by mixers 462 to −200 KHz. Thus, the desired signal at an IF of 200 KHz and the image signal at a down converted frequency of −200 KHz may both be input to receiver IF 465. In an example embodiment, BPFs 450A and 450B may typically pass both the desired signal (at 200 KHz) and the image signal (at −200 KHz). After being converted to a digital form, the receiver DSP may down convert the received signals (desired signal at 200 KHz and image signal at −200 KHz) to baseband frequency, and in the process may substantially cancel or reject the image signal. Imperfections in equipment, etc. and mismatches in the I and Q signals may impact the receiver's ability to reject or cancel the image signal.

However, in some cases, according to an example embodiment, the receiver 404 may need to reject an image that may be, for example, up to 50 dB greater than the desired signal. In order to provide such a significant image rejection, it may be beneficial for the digital I and Q signals (that are being converted to baseband) to be substantially the same amplitude and substantially 90 degrees out of phase (predetermine phase offset), to facilitate an effective rejection or cancellation of the image signal, for example. Any significant mismatches in amplitude or mismatch from the predetermined phase offset (e.g., less than or greater than 90 degree offset) for the digital I and Q signals may, at least in some cases, decrease the ability of receiver 404 to reject or cancel an image signal.

Therefore, according to an example embodiment, an I/Q calibration may be performed by receiver 404 based on signals provided or output by transmitter 202 in a calibration mode. According to an example embodiment, in a calibration mode, after receiving a channel assignment from an access point or base station, the transmitter 202 may determine a frequency of an image signal for the channel. The transmitter may then output a signal that is up converted by mixer 256 to an image frequency, e.g., a frequency that may be 400 KHz (or 2*IF) from the desired channel frequency. This signal output from transmitter 202 via loop back (e.g., output from amplifier 222 or 226, and fed back through mixer 256) to receiver 404 may be considered to be a simulated image signal at an image frequency for the channel. This simulated image signal may then be down converted by quadrature mixers 462 to an IF, e.g., –200 KHz, and produce analog I and Q signals at this frequency. (Note that the IF frequency may vary, based on the frequency of the received signal, and may be 200 KHz typically for a selected or desired channel, and may be for example, –200 KHz when processing and down converting an image signal or simulated image signal).

BPFs 450 may pass the I and Q analog signals, which are converted to digital form. Receiver DSP 466 may determine digitally a receiver in-phase/quadrature-phase (I/Q) signal calibration adjustment based on the image signal to improve a match in amplitudes and a predetermined phase shift (e.g., 90 degrees) between I and Q signals of the receiver during a calibration mode of operation.

Such an I/Q calibration may be performed, for example, by receiver DSP 466 determining a mismatch in amplitudes and mismatch in predetermined offset in phase between the digital I and Q signals from the image signal. The mismatch (or error) in predetermined phase offset might occur where the phases of the I and Q signals are less than or greater than the predetermined phase offset (e.g., less than or greater than 90 degrees). The receiver DSP 466 may digitally determine a receiver I/Q calibration adjustment to compensate for the mismatch in amplitudes and predetermined phase for the received I/Q components from the simulated image signal.

The I/Q calibration adjustment may be, for example, an adjustment in amplitude and/or phase for one or both of the I/Q signals. In an operation mode, with the transceiver 102 operating (or receiving signals) on the assigned channel for which I/Q calibration has been performed using a simulated image signal for the channel, receiver DSP 466 may then digitally apply the I/Q calibration adjustment to the received digital I and Q signals. The application or use of the I/Q calibration adjustment at the receiver 404 may improve the rejection or cancellation of an image signal during an operation mode, e.g., by placing or adjusting the amplitudes of the digital I/Q signals to substantially the same amplitude and adjusting the phase offset to substantially a predetermined offset.

In addition, the I/Q calibration may be repeated for each (or even all) of the channels, e.g., during a calibration mode for the transceiver 102, since the I/Q calibration adjustment may be different for each channel or frequency, and may also vary based on temperature and other variable conditions. In one example embodiment, the I/Q calibration may be repeated before the wireless transceiver receives each packet. By performing I/Q calibration for each packet, for example, this may allow such calibration to adapt (or be insensitive) to a transceiver's changing channels or frequencies. In addition, within each channel, the I/Q calibration may be performed over a variety of tones or frequencies across the 200 KHz BPF pass band, to provide better I/Q calibration within the channel, e.g., may perform I/Q calibration for each of, e.g., 10 or 100 or more tones or frequencies within a 200 KHz pass band, for example.

Referring to FIG. 4 again, LNAs 460 may provide an analog gain for the receiver input signal. In addition, amplifiers 452 may provide additional analog gain. Each amplifier 452 may be provided as part of a BPF 450 or associated with a BPF 450, in an example embodiment. Thus, amplifiers 452 may also be referred to as BPF amplifiers, for example. The receiver analog gain may be considered to be, for example, the variable LNA gain (provided by LNA 460) plus the variable BPF gain (provided by BPF amplifier 452). Receiver DSP 466 also provides a variable digital gain on received digital signals.

According to an example embodiment, the analog and digital gains of receiver 404 may be varied, for example, based on the level (or amplitude) of the receiver input signal. FIG. 5 is a chart illustrating an example gain control for the receiver of FIG. 4 according to an example embodiment. The gain control may include, for example, varying the gain provided by one or both analog amplifiers (or analog gain circuits), including LNAs 460 and BPF amplifiers 450. The gain control may also include varying the gain for the post-ADC digital gain provided by receiver DSP 466.

In FIG. 5, input range 502 identifies the level (or amplitude) of the receiver input signal (e.g., input to LNAs 460). LNA gain 504 identifies the gain provided by LNAs 460, BPF gain 506 identifies the gain provided by BPF amplifier 452 (or in general the gain provided by receiver IF section 465) and digital gain 510 identifies the gain provided by receiver DSP 466. The analog gain 508 may be calculated as: Analog gain (508)=LNA gain+BPF gain–6 dB (receiver front end loss). Thus, the analog gain 508 may be the sum of the two analog gains (LNA gain 504 and BPF gain 506), minus a front end receiver loss of 6 dB, for example. The total gain 512 may be calculated as: total gain (512)=analog gain (508)+digital gain (510). Thus, the total gain 512 for receiver 404 may be the sum of the analog gain 508 and the digital gain 510. The ADC input signal level (ADC In) 514 identifies the level of the signal input to the ADC 454. In some cases, it is desirable to maintain the level of the ADC input level 514 at a high level so as to use significant amount of the dynamic range of the ADCs 454, but not too high so as to saturate the ADC 454 in the presence of blockers (or blocker signals). ADC input level 514 may be calculated as: ADC input level (514)=receiver input (502)+analog gain (508). The gains (LNA gain 504, BPG gain 506, analog gain 508, digital gain 510 and total gain 512) shown in FIG. 5 may be provided in dB, while the signal levels (receiver input signal 502 and ADC input signal 514) may be provided in dBm, for example.

Referring to FIG. 5, for very low receiver input signals 502, e.g., –109 dBm to –104 dBm, the LNA gain 504 may be set to a highest or a relatively high value of 30 dBm, the BPF gain 506 may be set to 35 dB and decreasing as input signal increases, and the digital gain 510 may be set to a substantially constant value of 30 dB, for example. Thus, the total gain 512 is initially set to a fairly high value, such as 89 dB so receiver 404 may be sensitive to very low amplitude signals. The total gain 512 may typically decrease as the receiver input signal 502 increases. According to an example embodiment, the analog and digital gains may be adjusted to provide a substantially constant receiver output signal level (e.g., output by receiver DSP 466). This substantially constant receiver output signal level, which may be −20 dBm, for example, may provide baseband processor 112 a substantially constant and predictable input signal for processing, in an example embodiment.

As the receiver input signal level 502 increases from −109 dBm to −99 dBm, a blocker test may be applied to the receiver at around −99 dBm, in an example embodiment. A blocker test may include for example, applying a blocker signal at a specific frequency and amplitude to determine if the receiver can sufficiently obtain the desired signal in the presence of such a blocker. Many of the various wireless standards, such as GSM, EGSM, etc., have specific tests which wireless devices may be required to pass, such as a blocker test. In an example embodiment, the analog gain 508 may be decreased as the receiver input signal level increases, while maintaining the digital gain 510 substantially constant at −50 dB, for example. This decrease in analog gain allows the LNAs 460 to handle a larger blocker signal without saturating the LNAs, and may better allow the receiver to pass the blocker test. In an example embodiment, the LNA gain 504 may be decreased from 30 dB to 25 dB prior to the −99 dBm receiver input signal level 502 for the blocker test, to better allow a larger blocker signal to be received along with the desired signal, without saturating the LNAs 460 and BPF amplifiers 452, for example. In an example embodiment, when the LNA gain 504 decreases to 25 dB for better blocking tolerance, the signal is stronger and the noise figure degradation is acceptable.

As the receiver input signal level (502) increases to a level greater than the blocker test signal level (e.g., −99 dBm), the analog gain 508 may continue to decrease while the digital gain 510 may continue to be maintained substantially constant, for example. Also, the ADC input 514 may also continue to be maintained at a substantially constant level of −50 dBm, for example. Continuing to decrease the analog gain 508 and maintaining the ADC input level 514 at −50 dBm may better allow receiver 404 to receive the desired signal and an image signal without saturating the ADCs 454. An image test may be applied at a receiver input signal 502 of around −80 dBm, in an example embodiment. The image signal may be applied up to 50 dB greater than the desired signal. Thus, in an example embodiment, the digital gain 508 and the ADC input level may be maintained at a constant level, while decreasing the analog gain 508, at least up to the image test (e.g., −80 dBm for input signal 502), to allow the ADC 454 to receive and pass both the desired signal and image signal without the ADC 454 being saturated, for example. In an example embodiment, just before the image test, the LNA gain 504 may be decreased from 25 dB to 20 dB to better accommodate a larger image signal without saturating ADC 454, for example. According to an example embodiment, when the image test is being performed, it may be advantageous to maintain the ADC input signal level 514 at a relatively low signal level, such as −50 dBm (for example), in order to handle the image blocker which may be as much as 50 dB higher than the desired signal.

For receiver input signals 502 that are greater than −80 dBm (e.g., levels beyond the image test), statistically, image signals and blocker signals are not expected to be a problem. In addition, it may be desirable to increase the ADC input level 514 to make more complete use of the full dynamic range of the ADCs 454. Therefore, according to an example embodiment, for receiver input signals greater than −80 dBm up to approximately −44 dbM (for example), the analog gain 508 may be maintained at a substantially constant level, while the digital gain 510 decreases from 30 dB to 0 dB. Keeping the analog gain 508 substantially constant for receiver input signal levels 502 approximately between, for example, −71 dBm and −44 dBm may allow the ADC input level 514 to increase from −50 dBm to approximately −20 dBm, for example. In this manner, increasing the ADC input level 514 (e.g., by holding analog gain substantially constant as input signal levels increase and decreasing digital gain) may allow a better use of the full dynamic range of the ADC 454, for example.

In an example embodiment, a down-fading test may be applied at a receiver input signal level 502 of around −50 dBm, for example. The increase in ADC input level 514 from −50 dBm to approximately −27 or −25 dBm may provide additional dynamic range for the ADC 454 which may be useful in passing the down-fading test. After the down-fading test, the digital gain 510 and the analog gain 508 (including both LNA gain and BPF gain) are continually decreased until they reach zero, to allow for larger signals to be accommodated without saturating the various components of the receiver.

Figure 6:
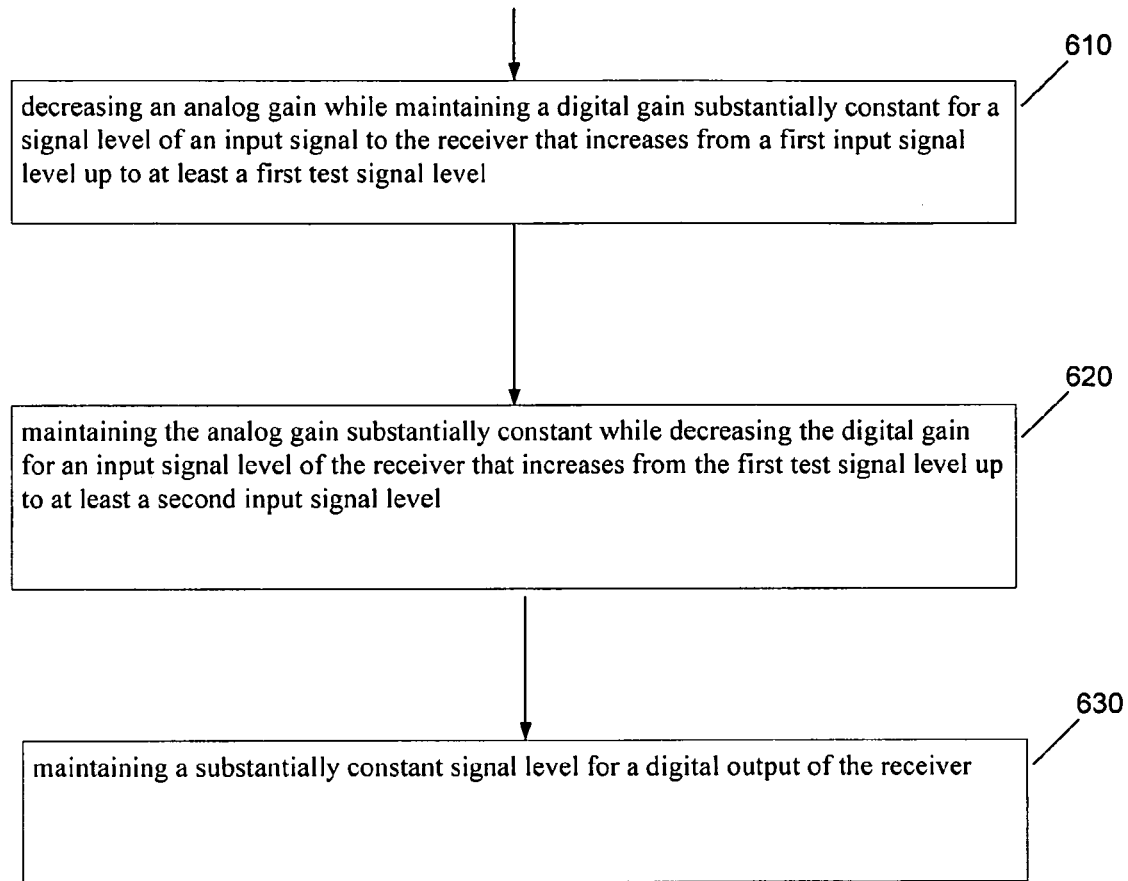
FIG. 6 is a flow chart illustrating operation of a wireless receiver according to an example embodiment.

FIG. 6 is a flow chart illustrating operation of a wireless receiver according to an example embodiment. For example, the flow chart of FIG. 6 may describe a method of varying an analog gain and a digital gain in a wireless receiver. At 610, an analog gain is decreased while maintaining a digital gain substantially constant for a receiver input signal to the receiver that increases from a first input signal level up to at least a first test signal level (e.g., up to a blocker test signal level or up to an image test signal level). Decreasing the analog gains, for example, may allow the receiver to better pass the blocker test and/or image test, and handle larger blocker signals without saturating the LNAs and/or ADCs.

At 620, the analog gain may be maintained substantially constant while decreasing the digital gain for a receiver input signal level that increases from the first test signal level up to at least a second input signal level. According to an example embodiment, maintaining the analog gain substantially constant while decreasing the analog gain as receiver input signal increases may allow the ADC input level to be increased to allow better use of the full dynamic range of the ADCs, especially for receiver input signals beyond (or greater than) the blocker test and/or image test.

At 630, a substantially constant signal level is maintained for a digital output of the receiver. This may be done, for example, by decreasing the overall gain (e.g., by varying the analog gain and/or digital gain) as the received input signal increases, such that the level of the output signal maintains a constant level. The may provide a substantially constant and predictable receiver output signal level that may be input to baseband processor 112.

Figure 7:
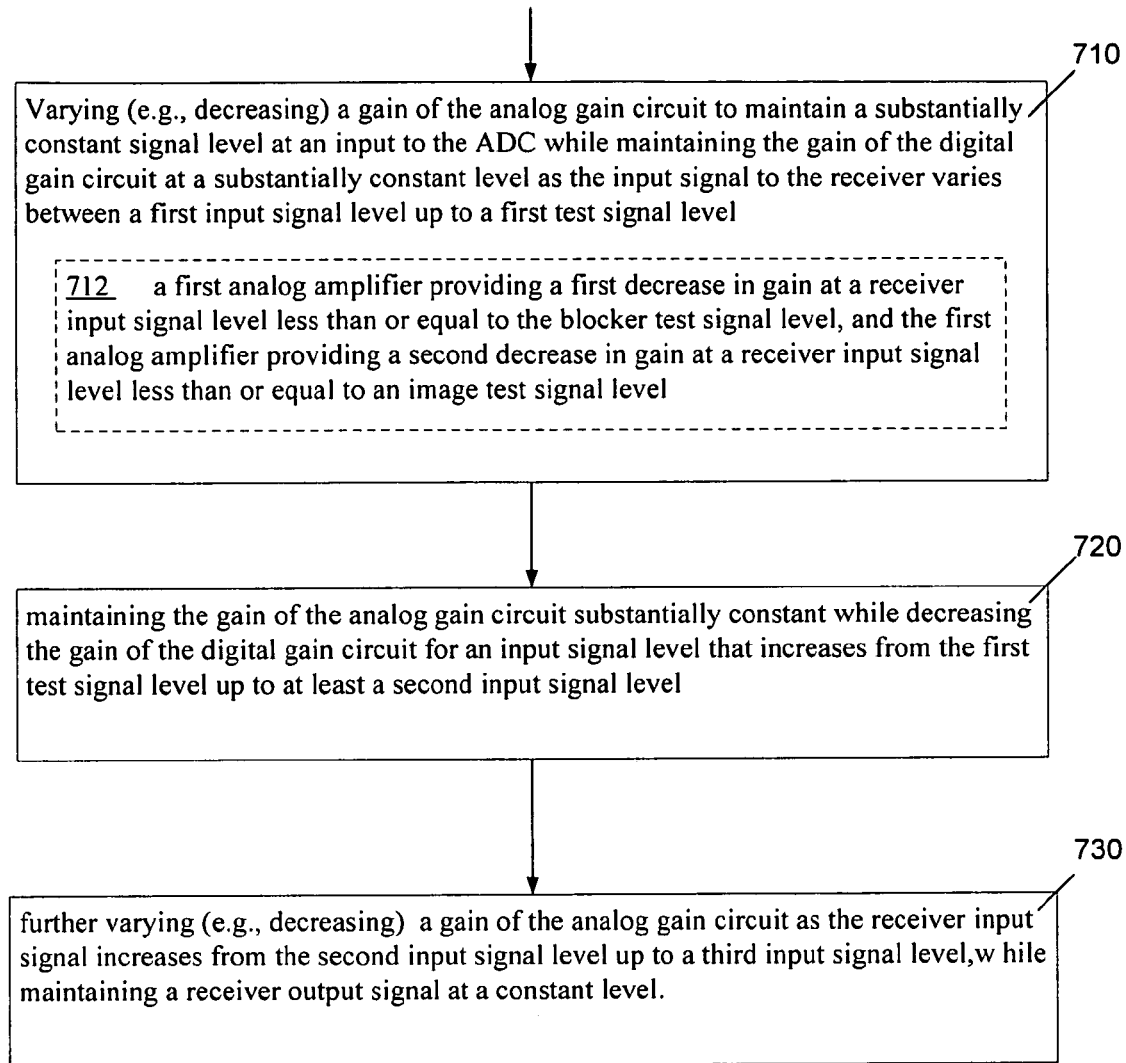
FIG. 7 is a flow chart illustrating operation of a wireless receiver according to another example embodiment.

FIG. 7 is a flow chart illustrating operation of a wireless receiver according to another example embodiment. According to an example embodiment, FIG. 7 may describe a method of varying gain in a wireless receiver. The wireless receiver may include, for example, an analog-to-digital converter (ADC), an analog gain circuit coupled to an input of the ADC, and a digital gain circuit coupled to an output of the ADC.

At 710, a gain of the analog gain circuit is varied to maintain a substantially constant signal level at an input to the ADC while maintaining the gain of the digital gain circuit at a substantially constant level as the input signal to the receiver varies between a first input signal level up to a first test signal level. For example, the analog gain circuit may include a first analog amplifier coupled to receive the receiver input signal and a second analog amplifier. The varying (710) may include the first analog amplifier providing a first decrease in gain at a receiver input signal level less than or equal to a blocker test signal level, and the first analog amplifier providing a second decrease in gain at a receiver input signal level less than or equal to an image test signal level.

At 720, the gain of the analog gain circuit is maintained substantially constant while decreasing the gain of the digital gain circuit for a receiver input signal level that increases from the first test signal level up to at least a second input signal level.

At 730, a gain of the analog gain circuit is further varied (e.g., decreased) as the receiver input signal increases from the second input signal level up to a third input signal level, while maintaining a receiver output signal at a constant level.

As noted above, the output signal from transmitter 202 may be looped back or fed back into receiver 204/404, to perform I/Q calibration. According to an example embodiment, the output level or amplitude of the transmit test signal looped back into the receiver for I/Q calibration may be adjusted based on the receiver gain. For example, as the receiver gain (e.g., total gain 512) decreases, the level of the transmit test signal may be increased. Or, in another example embodiment, the transmit signal level used for loopback I/Q calibration may be varied inversely as the receiver gain changes.

While certain features of the described implementations have been illustrated as described herein, many modifications, substitutions, changes and equivalents will now occur to those skilled in the art. It is, therefore, to be understood that the appended claims are intended to cover all such modifications and changes as fall within the true spirit of the various embodiments.

What is claimed is:

1. A method of varying an analog gain and a digital gain in a wireless receiver comprising:
   decreasing an analog gain while maintaining a digital gain substantially constant for a signal level of an input signal to the receiver that increases from a first input signal level up to at least a first test signal level; and
   maintaining the analog gain substantially constant while decreasing the digital gain for an input signal level of the receiver that increases from the first test signal level up to at least a second input signal level.

2. The method of claim 1 wherein the decreasing comprises decreasing an analog gain while maintaining a digital gain substantially constant for a signal level of an input signal to the receiver that increases from a first input signal level up to at least a blocker test signal level.

3. The method of claim 1 wherein the decreasing comprises decreasing an analog gain while maintaining a digital gain substantially constant for a signal level of an input signal to the receiver that increases from a first input signal level up to at least an image test signal level.

4. The method of claim 1 and further comprising maintaining a substantially constant signal level for a digital output of the receiver.

5. A method of varying gain in a wireless receiver, the wireless receiver including an analog-to-digital converter (ADC), an analog gain circuit coupled to an input of the ADC, and a digital gain circuit coupled to an output of the ADC, the method comprising:
   varying a gain of the analog gain circuit to maintain a substantially constant signal level at an input to the ADC while maintaining the gain of the digital gain circuit at a substantially constant level as the input signal to the receiver varies between a first input signal level up to a first test signal level; and
   maintaining the gain of the analog gain circuit substantially constant while decreasing the gain of the digital gain circuit for a receiver input signal level that increases from the first test signal level up to at least a second input signal level.

6. The method of claim 5 and further comprising:
   further varying a gain of the analog gain circuit as the receiver input signal increases from the second input signal level up to a third input signal level, while maintaining a receiver output signal at a constant level.

7. The method of claim 5 wherein the varying comprises varying a gain of the analog gain circuit to maintain a substantially constant signal level at an input to the ADC while maintaining the gain of the digital gain circuit at a substantially constant level as the input signal to the receiver varies between a first input signal level up to a blocker test signal level.

8. The method of claim 5 wherein the varying comprises varying a gain of the analog gain circuit to maintain a substantially constant signal level at an input to the ADC while maintaining the gain of the digital gain circuit at a substantially constant level as the input signal to the receiver varies between a first input signal level up to an image test signal level.

9. A method of varying gain in a wireless receiver, the wireless receiver including an analog-to-digital converter (ADC), an analog gain circuit coupled to an input of the ADC, and a digital gain circuit coupled to an output of the ADC, the method comprising:
   varying a gain of the analog gain circuit to maintain a substantially constant signal level at an input to the ADC while maintaining the gain of the digital gain circuit at a substantially constant level as the input signal to the receiver varies between a first input signal level up to a first test signal level; and
   wherein the amplitude gain circuit comprises a first analog amplifier coupled to receive the input signal and a second analog amplifier; and
   the varying comprising:
      the first analog amplifier providing a first decrease in gain at a receiver input signal level less than or equal to the first test signal level, and
      the first analog amplifier providing a second decrease in gain at a receiver input signal level less than or equal to a second test signal level.

10. A method of varying gain in a wireless receiver, the wireless receiver including an analog-to-digital converter (ADC), an analog gain circuit coupled to an input of the ADC, and a digital gain circuit coupled to an output of the ADC, the method comprising:
   varying a gain of the analog gain circuit to maintain a substantially constant signal level at an input to the ADC while maintaining the gain of the digital gain circuit at a substantially constant level as the input signal to the receiver varies between a first input signal level up to a first test signal level; and
   wherein the amplitude gain circuit comprises a first analog amplifier coupled to receive the input signal and a second analog amplifier; and
   the varying comprising:
      the first analog amplifier providing a first decrease in gain at a receiver input signal level less than or equal to a blocker test signal level, and the first analog amplifier providing a second decrease in gain at a receiver input signal level less than or equal to an image test signal level.

11. The method of claim 9 wherein the varying comprises varying a gain of the analog gain circuit to maintain a substantially constant signal level at an input to the ADC while maintaining the gain of the digital gain circuit at a substantially constant level as the input signal to the receiver varies between a first input signal level up to a blocker test signal level.

12. The method of claim 9 wherein the varying comprises varying a gain of the analog gain circuit to maintain a substantially constant signal level at an input to the ADC while maintaining the gain of the digital gain circuit at a substantially constant level as the input signal to the receiver varies between a first input signal level up to an image test signal level.

13. The method of claim 10 wherein the varying comprises varying a gain of the analog gain circuit to maintain a substantially constant signal level at an input to the ADC while maintaining the gain of the digital gain circuit at a substantially constant level as the input signal to the receiver varies between a first input signal level up to a blocker test signal level.

14. The method of claim 10 wherein the varying comprises varying a gain of the analog gain circuit to maintain a substantially constant signal level at an input to the ADC while maintaining the gain of the digital gain circuit at a substantially constant level as the input signal to the receiver varies between a first input signal level up to the image test signal level.

* * * * *

UNITED STATES PATENT AND TRADEMARK OFFICE
CERTIFICATE OF CORRECTION

PATENT NO. : 8,218,693 B2
APPLICATION NO. : 11/371850
DATED : July 10, 2012
INVENTOR(S) : Hooman Darabi It is certified that error appears in the above-identified patent and that said Letters Patent is hereby corrected as shown below:

In column 16, line 40, in claim 9, delete "amplitude" and insert -- analog --, therefor.

In column 16, line 61, in claim 10, delete "amplitude" and insert -- analog --, therefor.

Signed and Sealed this
Eighth Day of January, 2013

David J. Kappos
*Director of the United States Patent and Trademark Office*